(12) United States Patent
Williams et al.

(10) Patent No.: US 8,829,964 B1
(45) Date of Patent: Sep. 9, 2014

(54) COMPENSATED HYSTERESIS CIRCUIT

(71) Applicants: Jacob T. Williams, Austin, TX (US);
Jeffrey C. Cunningham, Austin, TX
(US); Gilles J. Muller, Austin, TX (US);
Karthik Ramanan, Austin, TX (US)

(72) Inventors: Jacob T. Williams, Austin, TX (US);
Jeffrey C. Cunningham, Austin, TX
(US); Gilles J. Muller, Austin, TX (US);
Karthik Ramanan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/836,882

(22) Filed: Mar. 15, 2013

(51) Int. Cl.
H03K 3/00 (2006.01)
H03K 3/011 (2006.01)

(52) U.S. Cl.
CPC .................................... H03K 3/011 (2013.01)
USPC .......................................... 327/206; 327/581

(58) Field of Classification Search
USPC .................................................. 327/206, 581
See application file for complete search history.

(56) References Cited

U.S. PATENT DOCUMENTS

| 4,563,594 | A | | 1/1986 | Koyama | |
|---|---|---|---|---|---|
| 4,571,504 | A | | 2/1986 | Iwamoto et al. | |
| 4,723,108 | A | * | 2/1988 | Murphy et al. | 323/315 |
| 4,775,806 | A | * | 10/1988 | Pfennings et al. | 327/543 |
| 4,918,334 | A | * | 4/1990 | Correale et al. | 327/541 |
| 5,945,859 | A | | 8/1999 | Pang | |
| 6,433,602 | B1 | * | 8/2002 | Lall et al. | 327/205 |
| 6,566,926 | B1 | * | 5/2003 | Patterson | 327/206 |
| 6,870,413 | B1 | | 3/2005 | Chang et al. | |
| 7,167,032 | B1 | | 1/2007 | Barlow | |
| 8,274,303 | B2 | | 9/2012 | Belser | |
| 8,451,047 | B2 | * | 5/2013 | Chen | 327/512 |
| 2003/0095011 | A1 | * | 5/2003 | Fry et al. | 331/176 |
| 2003/0137331 | A1 | | 7/2003 | Hirose | |
| 2003/0164697 | A1 | * | 9/2003 | Hardie | 324/207.15 |
| 2006/0017482 | A1 | | 1/2006 | Chauhan et al. | |
| 2008/0265931 | A1 | * | 10/2008 | Hsu et al. | 324/763 |
| 2009/0189665 | A1 | | 7/2009 | Wu et al. | |
| 2013/0043934 | A1 | * | 2/2013 | Heisley et al. | 327/537 |

OTHER PUBLICATIONS

U.S. Appl. No. 13/736,440, Tercariol, W. L. L., et al., "Schmitt Trigger Circuit with Near Rail-to-Rail Hysteresis", filed Jan. 8, 2013.

* cited by examiner

*Primary Examiner* — Adam Houston
(74) *Attorney, Agent, or Firm* — James L. Clingan, Jr.; Mary Jo Bertani

(57) ABSTRACT

A compensated hysteresis circuit comprises a hysteresis circuit including an output node and a first control transistor. The first control transistor provides feedback to the hysteresis circuit. A temperature and voltage compensation circuit includes a self-biasing threshold control circuit including an input coupled to the output node of the hysteresis circuit, and a first trim transistor coupled between the first control transistor of the hysteresis circuit and the self-biasing threshold control circuit.

20 Claims, 4 Drawing Sheets

US 8,829,964 B1

COMPENSATED HYSTERESIS CIRCUIT

BACKGROUND

1. Field

This disclosure relates to hysteresis circuits, and more particularly, to compensated hysteresis circuits.

2. Related Art

Hysteresis circuits, Schmitt triggers being the most commonly known, have uses where they, due to the hysteresis, are particularly efficient such as level detectors in noisy environments and oscillators. The utility of hysteresis circuits can depend on the precision that is needed for the particular application. Having two trigger points that go along with hysteresis can also make it difficult to have precision and also with variations due to temperature changes and due to power supply voltage variations which combines with other typical issues such as process variations.

Accordingly there is a need for a hysteresis circuit that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a compensated hysteresis circuit has set terminals that are connected to a temperature and voltage compensator circuit rather than to the power supply terminals. This provides for beneficial compensation for variations in temperature and power supply voltage. This is better understood by reference to the drawings and the following written description.

Figure 1:
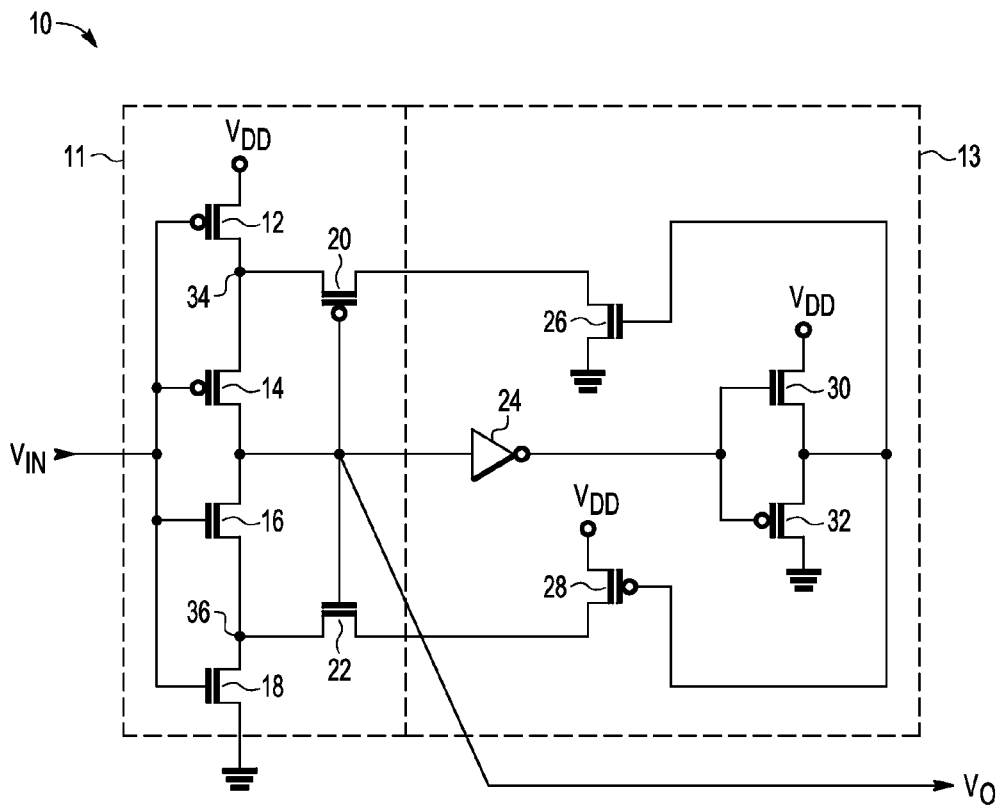
FIG. 1 is circuit diagram of a compensated hysteresis circuit according to a first embodiment.

Shown in FIG. 1 is a compensated hysteresis (CH) circuit 10 comprising P channel transistors 12, 14, 20, 28, and 32, an inverter 24, and N channel transistors 16, 18, 22, 26, and 30. Transistor 12 has source connected to a positive power supply terminal VDD that may simply referenced as VDD. Transistor 12 has a gate connected to an input Vin, and a drain connected to a node 34. Transistor 14 has a source connected to node 34, a gate connected to input Vin, and a drain that is connected to an output Vo that is the output of compensated hysteresis circuit 10. Transistor 16 has a drain connected to output Vo, a gate connected to input Vin, and a source connected to a node 36. Transistor 18 has a drain connected to node 36, a gate connected to input Vin, and source connected to a negative power supply terminal which is shown as ground. The negative power supply terminal is for being at a potential that is negative with respect to the voltage at VDD. Transistor 20 has source connected to node 34, a gate connected to output Vo, and a drain. Transistor 22 has a source connected node 36, a gate connected to output Vo, and a drain. Inverter 24 has an input connected to output Vo and an output. Transistor 26 has a drain connected to the drain of transistor 20, a source connected to ground, and a gate. Transistor 28 has a source connected to VDD, a drain connected to the drain of transistor 22, and a gate. Transistor 30 has a drain connected to VDD, a gate connected to the output of inverter 24, and a source connected to the gates of transistors 26 and 28. Transistor 32 has a source connected to the gates of transistors 26 and 28, a gate connected to the output of inverter 24, and a drain connected to ground. Transistors 12, 14, 16, 18, 20, and 22 comprise a hysteresis circuit 11. Transistors 26, 28, 30, and 32 and inverter 24 comprise a temperature and voltage compensation (TVC) circuit 13. Thus CH 10 comprises hysteresis circuit 11 and TVC 13. Transistors 26 and 28 provide the connection to the set points of hysteresis circuit 11.

Figure 2:
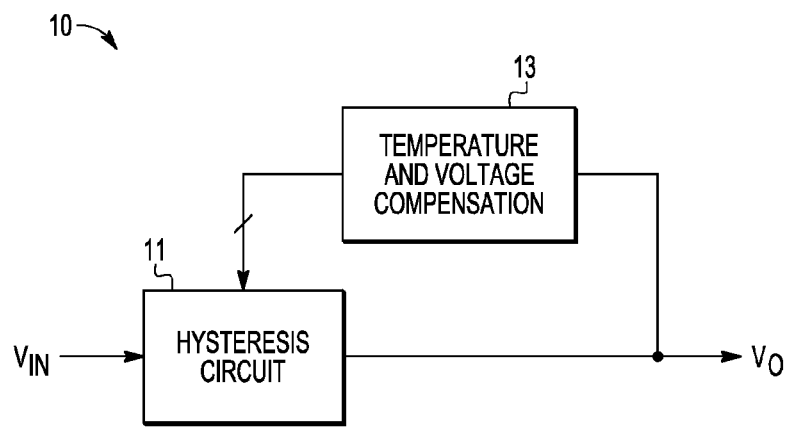
FIG. 2 is a block diagram of the compensated hysteresis circuit of FIG. 1.

Shown in FIG. 2 are hysteresis circuit 11 and TVC circuit 13 shown as blocks that form CH circuit 10. This shows an input of TVC circuit 13 connected to output Vo and providing an output to hysteresis circuit 11. The connection between the output of TVC circuit 13 and the input is the connections of the drains between transistors 20 and 26 and between transistors 22 and 28. This connecting point may be referenced as a set terminal which is sometimes used for such type of terminals in Schmitt triggers. In a Schmitt trigger the set terminals would be expected to be connected to VDD and ground which would be the drain of transistor 20 connected to ground and the drain of transistor 22 connected to VDD. The control applied by TVC circuit 13 to the set terminals provides for compensation for variations in temperature and power supply voltage. CH circuit 10 has a low switch point and a high switch point as is typical for hysteresis circuits. When the input is beginning at a relatively low voltage and going toward a relatively high voltage so that the output is beginning at a logic high for an inverting hysteresis circuit, when the high switch point is crossed, the output switches to a logic low. Similarly, when starting at a relatively high voltage and goes toward a relatively low voltage, the output switches from logic low to a logic high when the low switch point is crossed.

Figure 3:
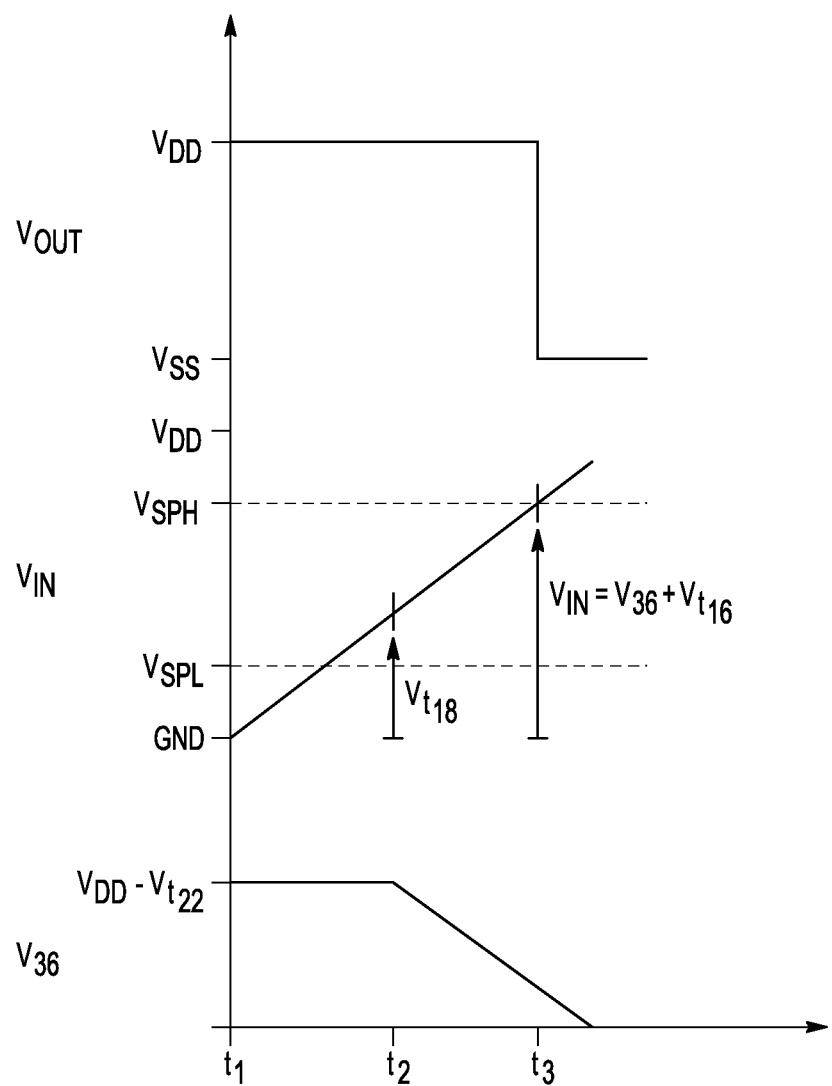
FIG. 3 is a timing diagram aiding in understanding the operation of the compensated hysteresis circuit of FIG. 1.

Shown in FIG. 3 is a timing diagram showing output VO, input Vin, and the voltage at node 36 for the case where the input at input Vin is going from the relatively low voltage to the relatively high voltage.

In operation and assuming a starting condition in which the input is below the low switch point as shown at time t1 in FIG. 3, transistors 12 and 14 are conductive. Keeping VDD at output Vo. Output Vo at a logic high is inverted by inverter 24 which causes transistor 32 to function as a source follower and transistor 30 to be non-conductive keeping transistor 26 non-conductive or nearly so due to its gate being a threshold voltage above ground. Transistors 30 and 32 function as a self-biasing threshold control circuit. Transistor 20 is also non-conductive. Node 36 is at the voltage at VDD minus the threshold voltage of transistor 22. As input Vin rises and then reaches the threshold voltage of transistor 18, transistor 18 becomes conductive at time t2. Transistor 18, being conductive, will begin reducing the voltage at node 36 as input Vin continues to rise. Transistor 16 remains non-conductive due until input Vin exceeds the voltage at node 36 by the threshold voltage of transistor 16. Also due to the rise in voltage of input Vin, transistors 12 and 14 are non-conductive. Thus, when transistor 16 becomes conductive, output Vo rapidly switches to a logic low at time t3. With output Vo at a logic low, inverter 24 switches to a logic high output which causes transistor 30 to function as a source follower and transistor 32 to be non-conductive. The result then is that transistor 26 becomes conductive. Transistor 20 becomes conductive holding node 34 to a magnitude of the threshold voltage of transistor 20 above ground. Transistor 28 is non-conductive or nearly so due to its gate being the magnitude of a threshold voltage below VDD. Transistor 22 is non-conductive. This sets the condition for requiring Vin to drop below the low switch point for Vo to switch states back to a logic high.

The operation of TVC circuit 13 is to reduce the change in switch points, which may also be called thresholds, and to reduce the change in the differential between switch points due to temperature and power supply voltage variations. For the case of an increase in temperature for the case described above for an input rising in voltage and causing an output switch by crossing the high switch point, the high temperature reduces the threshold voltages so that transistor 16 has a lower threshold voltage. The lower threshold of transistor 16 tends toward a reduced level for the high switch point. In this situation, transistor 28 is made conductive by transistor 32 providing a low voltage of the magnitude of its threshold voltage above ground. Due to the effect of the raised temperature causing reduced threshold voltage, the voltage supplied by transistor 32 to transistor 28 is lower which causes transistor 28 to be more conductive. Further transistor 28 has a lower threshold voltage which also has the effect of making transistor 28 more conductive due to the temperature increase. Similarly, transistor 22 becomes more conductive. The effect of transistors 22 and 28 having reduced threshold voltages and transistor 28 having a lower input voltage to increase its conductivity, the voltage at node 36 is increased to offset the reduced threshold voltage of transistor 16. The size of transistor 28 can be chosen to optimize the usage of the extra drive due to the lower input voltage to offset the effect of the threshold voltage reduction of transistor 16. Transistors 26 and 28 may be considered trim transistors.

Similarly for the case of input Vin going from a relatively high voltage to a relatively low voltage to cross the low switch point, an increase in temperature tends to cause transistor 14 to become conductive sooner due to the reduction in threshold voltage and transistor 26 is utilized to reduce this effect by having its input voltage be higher due to the temperature increase. Transistors 20 and 26 also have threshold voltage decreases as well. Similar to the case for transistor 28, the increase in gate drive of transistor 26 is due to the decrease in threshold voltage of the source follower transistor which in this case is transistor 30. The output from transistor 30 is a threshold voltage below the voltage at VDD. With the reduced threshold voltage, the voltage output by transistor 30 is higher and thus provides more drive for transistor 26. Transistor 26 is sized to optimize the offset to the decrease in voltage to transistor 14.

Further there is less variation in the difference between the high and low switch points with the presence of transistors 26 and 28 being driven by a source follower. Transistors 20 and 22 can be made larger with more current drive due to the presence of transistors 26 and 28. Thus, for example, transistors 20 and 26 can be varied in size relative to each other to make it so that there is less variation in the low switch point. This structure provides for more flexibility in compensating for changes in power supply voltage. In many applications, such as for an oscillator, the change is switch point is not as important as the change in the difference between switch points. Thus, the sizes of transistors 20, 26, 22, and 28 can be varied to reduce variations in the difference between switch points due to power supply voltage variation. Also, the output of the source follower formed with transistors 30 and 32, if left static, may drift to either VDD or ground. If used as an oscillator this is not an issue. If the use potentially has static periods, then it may be necessary to apply a high impedance bias circuit to the output of the source follower to maintain a known voltage.

Figure 4:
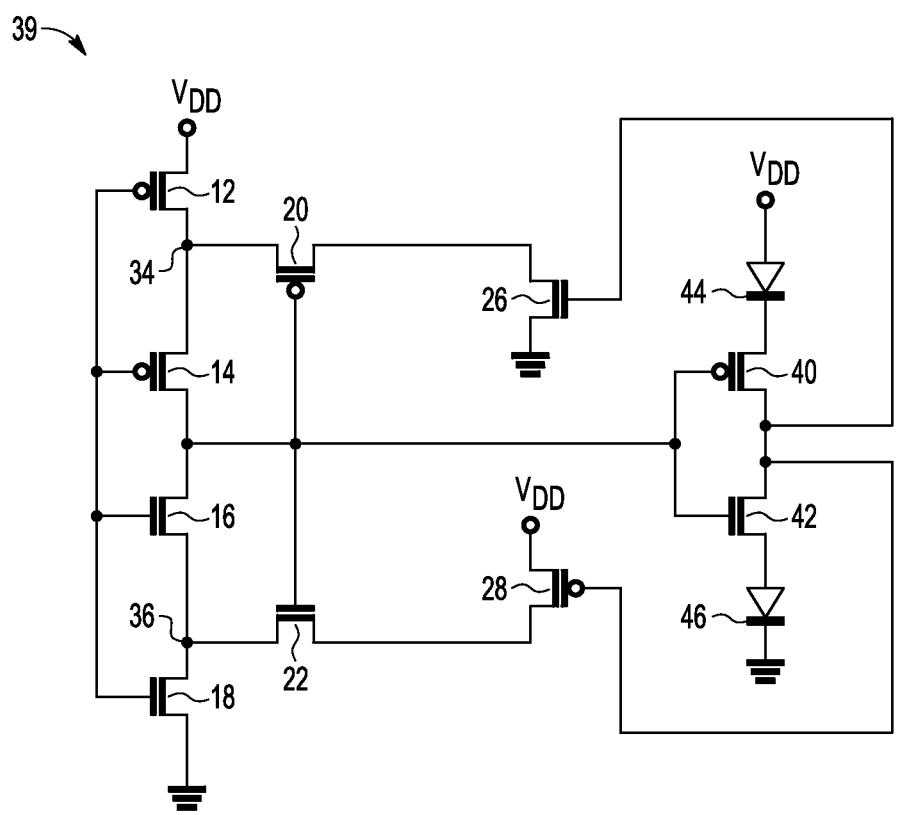
FIG. 4 is a circuit diagram of a compensated hysteresis circuit according to a second embodiment.

Shown in FIG. 4 is a compensated hysteresis (CH) circuit 39 in which the source follower and inverter 24 have been replaced with an inverter comprised of P channel transistor 40 and N channel transistor 42 with diode-connected transistors to form diodes 44 and 46. With diode-connected transistors, the output of the inverter provides a logic low at a threshold voltage above ground and a logic high at a threshold voltage below VDD. The operation is the same as described for CH circuit 10.

Figure 5:
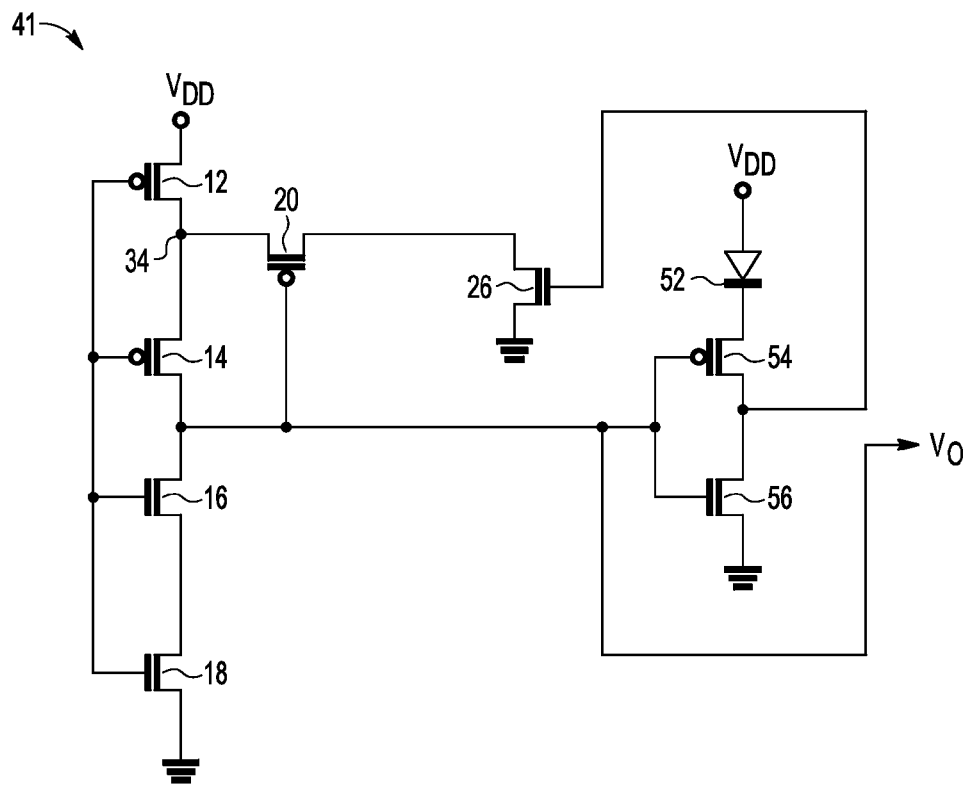
FIG. 5 is a circuit diagram of a compensated hysteresis circuit according to a third embodiment.

Shown in FIG. 5 is a compensated hysteresis (CH) circuit 41 in which the high switch point is simply set by threshold voltage of a single transistor, transistor 50 in this case. The low switch point is set the same as shown for CH circuit 39 of FIG. 4 using a diode-connected transistor in series with the P channel transistor of the inverter that replaces inverter 24 and the source follower formed by transistors 30 and 32 of CH circuit 10. Similarly the reverse could be implemented in which a P channel transistor could be used for the low switch point and an arrangement analogous to transistors 16, 18, 22, and 28 in combination with an inverter like inverter 24 and a source follower like that of transistors 32 and 30 for driving transistor 28.

Thus, it is shown that a CH circuit can be utilized in a variety of forms to achieve a circuit with control over variations in the low and high switch points over changes in temperature and power supply voltage.

By now it should be appreciated that there has been provided a compensated hysteresis circuit that includes a hysteresis circuit including an output node and a first control transistor, the first control transistor provides feedback to the hysteresis circuit. The compensated hysteresis circuit further includes a temperature and voltage compensation circuit. The temperature and voltage compensation circuit includes a self-biasing threshold control circuit including an input coupled to the output node of the hysteresis circuit and a first trim transistor coupled between the first control transistor of the hysteresis circuit and the self-biasing threshold control circuit. The compensated hysteresis circuit may have a further characterization by which the temperature and voltage compensation circuit includes an inverter coupled between the output of the hysteresis circuit (Vo) and the input of the self-biasing threshold control circuit. The compensated hysteresis circuit may have a further characterization by which the self-biasing threshold control circuit includes a source follower circuit, the source follower circuit including an N-channel transistor having a gate electrode, a drain electrode and a source electrode and a P-channel transistor having a gate electrode, a drain electrode and a source electrode, the source electrode of the N-channel transistor is coupled to the source electrode of the P-channel transistor and the gate electrodes of the N and P-channel transistors are coupled to an output of the inverter. The compensated hysteresis circuit may have a further characterization by which the self-biasing threshold control circuit includes an N-channel transistor having a gate electrode, a drain electrode and a source electrode and a P-channel transistor having a gate electrode, a drain electrode and a source electrode, wherein the drain electrode of the N-channel transistor is coupled to the drain electrode of the P-channel transistor, the gate electrodes of the N and P-channel transistors are coupled to the output node of the hysteresis circuit, the source electrode of the P-channel transistor is coupled to one of a group consisting of a diode and the gate electrode of the P-channel transistor, the source electrode of the N-channel transistor is coupled to one of a group consisting of a diode and the gate electrode of the N-channel transistor. The compensated hysteresis circuit may have a further characterization by which the first control transistor is a P-channel transistor and the first trim transistor is an N-channel transistor having a drain electrode coupled to a drain electrode of the first control transistor. The compensated hysteresis circuit may have a further characterization by which a source electrode of the first trim transistor is coupled to ground and a source electrode of the first control transistor is coupled to an output of a low threshold section of the hysteresis circuit. The compensated hysteresis circuit may have a further characterization by which the hysteresis circuit further includes a second control transistor coupled to provide feedback to the hysteresis circuit and the temperature and voltage compensation circuit further includes a second trim transistor coupled between the second control transistor of the hysteresis circuit and the self-biasing threshold control circuit. The compensated hysteresis circuit may have a further characterization by which the second control transistor is an N-channel transistor and the second trim transistor is a P-channel transistor having a drain electrode coupled to a drain electrode of the second control transistor. The compensated hysteresis circuit may have a further characterization by which a source electrode of the second trim transistor is coupled to a supply voltage and a source electrode of the second control transistor is coupled to an output of a high threshold section of the hysteresis circuit.

Also described is a compensated hysteresis circuit having a hysteresis circuit including a first threshold section, an output node (Vo) coupled to an output of the first threshold section, and a first control transistor coupled to provide feedback to the first threshold section. The compensated hysteresis circuit further includes a temperature and voltage compensation circuit including a self-biasing threshold control circuit including an input coupled to the output node of the hysteresis circuit and a first trim transistor coupled between the first control transistor of the hysteresis circuit and the self-biasing threshold control circuit. The compensated hysteresis circuit may further include a second threshold section of the hysteresis circuit, a second control transistor coupled to provide feedback to the second threshold section, and a second trim transistor coupled between the second control transistor of the hysteresis circuit and the self-biasing threshold control circuit. The compensated hysteresis circuit may further include an inverter having an input coupled to the output node of the hysteresis circuit and an input coupled to gate electrodes of transistors at the input of the self-biasing threshold control circuit. The compensated hysteresis circuit may have a further characterization by which. an inverter having an input coupled to the output node of the hysteresis circuit and an input coupled to gate electrodes of transistors at the input of the self-biasing threshold control circuit an inverter having an input coupled to the output node of the hysteresis circuit and an input coupled to gate electrodes of transistors at the input of the self-biasing threshold control circuit an inverter having an input coupled to the output node of the hysteresis circuit and an input coupled to gate electrodes of transistors at the input of the self-biasing threshold control circuit. The compensated hysteresis circuit may have a further characterization by which the self-biasing threshold control circuit includes a source follower circuit, the source follower circuit including an N-channel transistor having a gate electrode, a drain electrode and a source electrode and. The compensated hysteresis circuit may have a further characterization by which a P-channel transistor having a gate electrode, a drain electrode and a source electrode, the source electrode of the N-channel transistor is coupled to the source electrode of the P-channel transistor and the gate electrodes of the N and P-channel transistors are coupled to the output node of the hysteresis circuit. The compensated hysteresis circuit may have a further characterization by which the self-biasing threshold control circuit includes an N-channel transistor having a gate electrode, a drain electrode and a source electrode and a P-channel transistor having a gate electrode, a drain electrode and a source electrode, wherein the drain electrode of the N-channel transistor is coupled to the drain electrode of the P-channel transistor, the gate electrodes of the N and P-channel transistors are coupled to the output node of the hysteresis circuit, the source electrode of the P-channel transistor is coupled to one of a group consisting of a diode and the gate electrode of the P-channel transistor, and the source electrode of the N-channel transistor is coupled to one of a group consisting of a diode and the gate electrode of the N-channel transistor. The compensated hysteresis circuit may have a further characterization by which the first control transistor is a P-channel transistor and the first trim transistor is an N-channel transistor having a drain electrode coupled to a drain electrode of the first control transistor. The compensated hysteresis circuit may have a further characterization by which a source electrode of the first trim transistor is coupled to ground and a source electrode of the first control transistor is coupled to an output of the first threshold section of the hysteresis circuit.

Described also is a method of compensating temperature and voltage variations in a hysteresis circuit. The method includes modulating a first threshold voltage of the hysteresis circuit by coupling a bias voltage to a control transistor in the hysteresis circuit, wherein the bias is generated using a self-biasing threshold control circuit that has an input coupled to the output of the hysteresis circuit and an output that is the bias voltage. The method further includes applying the bias voltage to a gate of a trim transistor that is coupled to bias the control transistor in the hysteresis circuit. The method may further include using variation in threshold voltage over temperature of transistors in the self-biasing threshold control circuit to modulate voltage output by a first threshold section of the hysteresis circuit. The method may have a further characterization by which a combination of a trim transistor in the self-biasing threshold control circuit being coupled to the control transistor in the hysteresis circuit decreases an effective sizing ratio of the control transistor relative to transistors in the first threshold section thereby decreasing threshold voltage variation of the transistors in the first threshold section over supply voltage variation.

Although the invention is described herein with reference to specific embodiments, various modifications and changes can be made without departing from the scope of the present invention as set forth in the claims below. For example, an exemplary hysteresis circuit was shown in combination with the various temperature and voltage compensation circuits but other hysteresis circuits may also benefit from the temperature and voltage compensation circuits. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A compensated hysteresis circuit comprising:
   a hysteresis circuit including an output node and a first control transistor, the first control transistor provides feedback to the hysteresis circuit;
   a temperature and voltage compensation circuit including:
      a self-biasing threshold control circuit including an input coupled to the output node of the hysteresis circuit, and
      a first trim transistor coupled between the first control transistor of the hysteresis circuit and the self-biasing threshold control circuit.

2. The compensated hysteresis circuit of claim 1, wherein the temperature and voltage compensation circuit includes an inverter coupled between the output of the hysteresis circuit (Vo) and the input of the self-biasing threshold control circuit.

3. The compensated hysteresis circuit of claim 2, wherein the self-biasing threshold control circuit includes a source follower circuit, the source follower circuit including
   an N-channel transistor having a gate electrode, a drain electrode and a source electrode, and
   a P-channel transistor having a gate electrode, a drain electrode and a source electrode, the source electrode of the N-channel transistor is coupled to the source electrode of the P-channel transistor and the gate electrodes of the N and P-channel transistors are coupled to an output of the inverter.

4. The compensated hysteresis circuit of claim 1, wherein the self-biasing threshold control circuit includes
   an N-channel transistor having a gate electrode, a drain electrode and a source electrode, and
   a P-channel transistor having a gate electrode, a drain electrode and a source electrode, further wherein
      the drain electrode of the N-channel transistor is coupled to the drain electrode of the P-channel transistor,
      the gate electrodes of the N and P-channel transistors are coupled to the output node of the hysteresis circuit,
      the source electrode of the P-channel transistor is coupled to one of a group consisting of a diode and the gate electrode of the P-channel transistor, and
      the source electrode of the N-channel transistor is coupled to one of a group consisting of a diode and the gate electrode of the N-channel transistor.

5. The compensated hysteresis circuit of claim 1, wherein the first control transistor is a P-channel transistor and the first trim transistor is an N-channel transistor having a drain electrode coupled to a drain electrode of the first control transistor.

6. The compensated hysteresis circuit of claim 5, wherein a source electrode of the first trim transistor is coupled to ground and a source electrode of the first control transistor is coupled to an output of a low threshold section of the hysteresis circuit.

7. The compensated hysteresis circuit of claim 1 wherein:
   the hysteresis circuit further includes a second control transistor coupled to provide feedback to the hysteresis circuit;
   the temperature and voltage compensation circuit further includes:
      a second trim transistor coupled between the second control transistor of the hysteresis circuit and the self-biasing threshold control circuit.

8. The compensated hysteresis circuit of claim 7, wherein the second control transistor is an N-channel transistor and the second trim transistor is a P-channel transistor having a drain electrode coupled to a drain electrode of the second control transistor.

9. The compensated hysteresis circuit of claim 8, wherein a source electrode of the second trim transistor is coupled to a supply voltage and a source electrode of the second control transistor is coupled to an output of a high threshold section of the hysteresis circuit.

10. A compensated hysteresis circuit comprising:
    a hysteresis circuit including
       a first threshold section,
       an output node (Vo) coupled to an output of the first threshold section,
       a first control transistor coupled to provide feedback to the first threshold section, and
    a temperature and voltage compensation circuit including
       a self-biasing threshold control circuit including an input coupled to the output node of the hysteresis circuit,
       a first trim transistor coupled between the first control transistor of the hysteresis circuit and the self-biasing threshold control circuit.

11. The compensated hysteresis circuit of claim 10 further comprising:
    a second threshold section of the hysteresis circuit,
    a second control transistor coupled to provide feedback to the second threshold section;
    a second trim transistor coupled between the second control transistor of the hysteresis circuit and the self-biasing threshold control circuit.

12. The compensated hysteresis circuit of claim 10 further comprising:
    an inverter having an input coupled to the output node of the hysteresis circuit and an input coupled to gate electrodes of transistors at the input of the self-biasing threshold control circuit.

13. The compensated hysteresis circuit of claim 11, wherein the self-biasing threshold control circuit includes a source follower circuit, the source follower circuit including
    an N-channel transistor having a gate electrode, a drain electrode and a source electrode, and
    a P-channel transistor having a gate electrode, a drain electrode and a source electrode, the source electrode of the N-channel transistor is coupled to the source electrode of the P-channel transistor and the gate electrodes of the N and P-channel transistors are coupled to the output node of the hysteresis circuit.

14. The compensated hysteresis circuit of claim 10, wherein the self-biasing threshold control circuit includes
    an N-channel transistor having a gate electrode, a drain electrode and a source electrode, and
    a P-channel transistor having a gate electrode, a drain electrode and a source electrode, further wherein
       the drain electrode of the N-channel transistor is coupled to the drain electrode of the P-channel transistor, the gate electrodes of the N and P-channel transistors are coupled to the output node of the hysteresis circuit, the source electrode of the P-channel transistor is coupled to one of a group consisting of a diode and the gate electrode of the P-channel transistor, and the source electrode of the N-channel transistor is coupled to one of a group consisting of a diode and the gate electrode of the N-channel transistor.

15. The compensated hysteresis circuit of claim 10, wherein the first control transistor is a P-channel transistor and the first trim transistor is an N-channel transistor having a drain electrode coupled to a drain electrode of the first control transistor.

16. The compensated hysteresis circuit of claim 15, wherein a source electrode of the first trim transistor is coupled to ground and a source electrode of the first control transistor is coupled to an output of the first threshold section of the hysteresis circuit.

17. A method of compensating temperature and voltage variations in a hysteresis circuit comprising:

modulating a first threshold voltage of the hysteresis circuit by coupling a bias voltage to a control transistor in the hysteresis circuit, wherein the bias is generated using a self-biasing threshold control circuit that has an input coupled to the output of the hysteresis circuit and an output that is the bias voltage.

18. The method of claim 17 further comprising:

applying the bias voltage to a gate of a trim transistor that is coupled to bias the control transistor in the hysteresis circuit.

19. The method of claim 17 further comprising:

using variation in threshold voltage over temperature of transistors in the self-biasing threshold control circuit to modulate voltage output by a first threshold section of the hysteresis circuit.

20. The method of claim 17 wherein a combination of a trim transistor in the self-biasing threshold control circuit being coupled to the control transistor in the hysteresis circuit decreases an effective sizing ratio of the control transistor relative to transistors in the first threshold section thereby decreasing threshold voltage variation of the transistors in the first threshold section over supply voltage variation.

* * * * *